United States Patent
Tormey et al.

(10) Patent No.: US 6,399,230 B1
(45) Date of Patent: Jun. 4, 2002

(54) MULTILAYER CERAMIC CIRCUIT BOARDS WITH EMBEDDED RESISTORS

(75) Inventors: Ellen Schwartz Tormey, Princeton Junction; Ashok Narayan Prabhu, East Windsor, both of NJ (US); Ponnusamy Palinasamy, Lansdale, PA (US)

(73) Assignees: Sarnoff Corporation, Princeton, NJ (US); Sharp Corporation, Osaka (JP)

( * ) Notice: Subject to any disclaimer, the term of this patent is extended or adjusted under 35 U.S.C. 154(b) by 0 days.

(21) Appl. No.: 09/248,636

(22) Filed: Feb. 9, 1999

Related U.S. Application Data

(63) Continuation-in-part of application No. 08/812,832, filed on Mar. 6, 1997, now abandoned.

(51) Int. Cl.$^7$ .......................... B32B 9/00; C03C 3/066; C03C 10/02; C03C 10/04
(52) U.S. Cl. ................... 428/702; 428/210; 428/432; 428/901; 252/514; 29/610.1; 501/5; 501/10; 501/17; 501/19; 501/32; 501/79
(58) Field of Search ................ 156/89.12, 89.16, 156/89.17; 29/610.1, 620, 621, 851; 428/901, 210, 432, 433, 434, 428, 688, 693, 701, 702; 252/518.1, 520.1, 521.1, 514

(56) References Cited

U.S. PATENT DOCUMENTS

| | | | |
|---|---|---|---|
| 3,947,277 A | | 3/1976 | Carnahan et al. |
| 3,974,107 A | * | 8/1976 | Carcia |
| 3,989,874 A | | 11/1976 | Maher |
| 4,015,230 A | | 3/1977 | Nitta et al. |
| 4,284,970 A | | 8/1981 | Berrin et al. |
| 4,489,429 A | | 12/1984 | Tosaki et al. |
| 4,490,429 A | * | 12/1984 | Tosaki et al. |
| 4,539,223 A | | 9/1985 | Hormadaly |
| 4,650,923 A | | 3/1987 | Nishigaki et al. |
| 4,655,864 A | | 4/1987 | Rellick |
| 4,732,798 A | | 3/1988 | Ishida et al. |
| 4,748,085 A | | 5/1988 | Fukuda et al. |
| 4,755,369 A | | 7/1988 | Yoshiharu |
| 4,795,670 A | | 1/1989 | Nishigaki et al. |
| 4,796,356 A | | 1/1989 | Ozaki |
| 4,814,304 A | | 3/1989 | Takeuchi et al. |
| 4,830,878 A | | 5/1989 | Kaneko et al. |
| 4,870,746 A | | 10/1989 | Klaser |
| 5,064,997 A | | 11/1991 | Fang et al. |
| 5,204,166 A | | 4/1993 | Ito et al. |
| 5,232,765 A | | 8/1993 | Yano et al. |
| 5,264,272 A | | 11/1993 | Tanabe et al. |
| 5,383,093 A | | 1/1995 | Nagasaka |
| 5,495,398 A | | 2/1996 | Takiar et al. |
| 5,581,876 A | | 12/1996 | Prabhu et al. |
| 5,725,808 A | | 3/1998 | Tormey et al. |
| 5,855,711 A | * | 1/1999 | Araki et al. |

FOREIGN PATENT DOCUMENTS

| | | | |
|---|---|---|---|
| JP | 62-092864 | | 4/1987 |
| JP | 64-59802 | | 3/1989 |
| JP | 64-77990 | | 3/1989 |
| JP | 403148101 A | * | 6/1991 |
| JP | 404326703 A | * | 11/1992 |

OTHER PUBLICATIONS

International Search Report for PCT/US00/03291, filed Feb. 9, 2000.

Utsumi et al. "Monolithic <ui;tocomponents Ceramic (MMC) Substrate", Ferrelectrics, vol. 68, pp 157–179.

* cited by examiner

*Primary Examiner*—Deborah Jones
*Assistant Examiner*—Jennifer McNeil
(74) *Attorney, Agent, or Firm*—William J. Burke

(57) ABSTRACT

Resistors can be screen printed onto a green tape stack from a resistor ink comprising ruthenium oxide and a sufficient amount of a low melting temperature glass so that the resultant mixture fires at a temperature of 850–900° C. A conductive layer, as of silver, terminates the screen printed resistor layer and one or two green tapes are applied over the resistor layer to embed the resistors during firing. A final conductive layer is applied after firing.

9 Claims, 1 Drawing Sheet

MULTILAYER CERAMIC CIRCUIT BOARDS WITH EMBEDDED RESISTORS

This application is a continuation-in-part of application Ser. No. 08/812,832 filed Mar. 6, 1997, now abandoned.

This invention relates to multilayer ceramic printed circuit boards including co-fired passive components. More particularly, this invention relates to multilayer ceramic printed circuit boards including embedded resistors and method of making them.

BACKGROUND OF THE INVENTION

Low temperature multilayer ceramic circuit boards are known that are suitable for use with low melting temperature conductive metals, such as silver, gold and copper. They have a low thermal coefficient of expansion (TCE) and thus they may be compatible with silicon or gallium arsenide. The ceramic circuit boards are made from glasses that can be fired at low temperatures, i.e., less than 1000° C. The multilayer circuit boards are made in known manner by admixing suitable glass powders with an organic vehicle, including resin, solvents, dispersants and the like, and casting the resultant slurry into a thin tape called green tape. A circuit may be screen printed onto the green tape using a conductive ink formulation comprising a conductive metal powder, an organic vehicle and a powdered glass, usually the same or a similar glass to that used to make the green tape.

When more than one green tape is to be stacked, via holes are punched into the tape which are filled with a via fill ink, also made with a conductive material, an organic vehicle and a glass, which will provide electrical contact between the circuits on the various green tape layers. The patterned green tapes are aligned and compressed or laminated under pressure prior to firing.

More recently, the multilayer ceramic circuit boards have been adhered to a metal support substrate to increase the strength of the multilayer board. The support board has a metal core that is coated with a bonding glass that adheres the ceramic tapes to the support substrate during co-firing. The use of a bonding glass has another advantage in that it greatly reduces the shrinkage of the green tapes during firing in the x and y dimensions, so that most of the shrinkage occurs only in the z, or thickness, dimension. The glasses used for the green tapes must have a TCE matched to the metal support however, to prevent delamination or cracking of the fired glass. Mixtures of crystallizable and non-crystallizable glasses, optionally including inorganic fillers, are also known that have the desired TCE characteristics.

Up to the present time, when multilayer ceramic circuit boards are to include passive components such as resistors or capacitors, discrete components have been mounted to the top surface of the fired boards using solder or epoxy adhesives to adhere the components to the multilayer ceramic. The incorporation of these discrete components increases the number of steps needed to make them, i.e., the components must be aligned and adhered to the ceramic multilayer board, and connected to a source of power. Further in order to accommodate a number of discrete devices, the multilayer boards have to be large. Thus the costs of making such boards is high.

It would be advantageous to be able to screen print passive components onto multilayer, low temperature co-fired ceramic circuit boards because the packing density can be increased, reducing the size and cost of the packaging. Using the recently developed low firing temperature glasses and a metal support board that reduces shrinkage in the x and y dimensions, screen printing of such components to tight tolerances and high precision placement becomes feasible. Further, because fewer interconnects need to be made, reliability would also be improved.

In a copending application filed concurrently herewith, the present inventors have interleaved two types of green tapes so that large numbers of green tapes can be stacked without shrinkage in two dimensions.

Thus it would be highly desirable to develop appropriate ink compositions that can be screen printed onto green tape layers to form embedded resistors to tight tolerances with high precision placement.

SUMMARY OF THE INVENTION

We have found a method of making thick film resistor ink compositions based on ruthenium oxide ($RuO_2$) and appropriate glasses that sinter at low temperatures, e.g., 850–900° C., together with suitable organic vehicles. The resistor inks can be screen printed onto known low firing temperature green tape stacks, preferably supported on a metal support substrate and covered with one or two green tapes to produce embedded resistors having a wide range of resistor values and thermal coefficient of resistance (TCR) values. Small amounts of barium titanate can also be added to the resistor inks to adjust TCR values. The resistors can be connected to a source of power by means of a conductive layer screen printed on top of the fired, supported green tape stack. After printing the resistors and other circuitry, the multiple green tape layers are aligned, laminated together, applied to a metal support substrate via a bonding glass, and co-fired in air at a temperature of about 700–900° C. The resultant embedded resistors are stable and reliable.

DETAILED DESCRIPTION OF THE INVENTION

Figure 1:
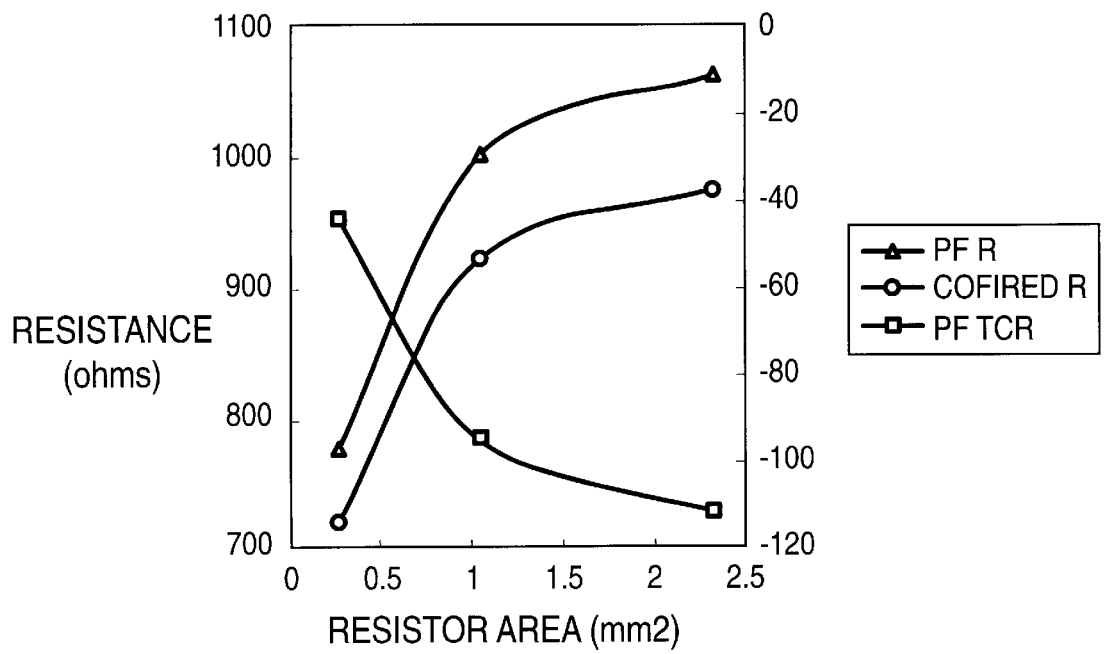
FIG. 1 is a graph of resistor area versus resistance and TCR for square resistors.

We have discovered that resistor inks with resistor values of from 300 ohm/sq to 100 Kohms/sq and a TCR of $\leq \pm 200$ ppm/° C. over a temperature range of room temperature to 125° C., can be made in accordance with the invention. The target properties for a particular cellular telephone application are 1 Kohm/sq and a TCR less than or equal to 200 ppm/° C. over the room temperature to 125° C. range.

The resistor inks are made from a fine particle size, high surface area $RuO_2$ powder having the characteristics as summarized in Table I.

TABLE I

| Property | Specification |
| --- | --- |
| Particle size, microns | 0.15–0.45 |
| Surface Area ($m^2/g$) | 15–25 |
| Purity - Wt % Ru | 73–76 |

The $RuO_2$ is mixed with one or more low temperature firing glasses to reduce the firing temperature of the conductor powder.

Suitable low temperature firing glasses include a zinc borate glass described in U.S. Pat. No. 5,581,876 to Prabhu et al, herein incorporated by reference. These glasses comprise about 45–55% by weight of zinc oxide; from about 30–40% by weight of boron oxide; from about 3–7% by weight of calcium oxide and about 3–7% by weight of aluminum oxide.

Another suitable glass composition having a low firing temperature includes a zinc-magnesium-borosilicate glass described in U.S. Pat. No. 5,725,808 to Tormey et al, also incorporated herein by reference. These glasses comprise from about 20–55%, preferably about 25–30% by weight of zinc oxide, from about 10–30%, preferably 20–28% by weight of magnesium oxide; from about 10–35%, preferably about 15–20% by weight of boron oxide, from about 10–40%, preferably about 20–30% by weight of silica, and up to about 10%, preferably about 3–7% by weight of alumina and up to about 3%, preferably up to about 2% by weight of cobalt oxide as a coloring agent.

Two suitable glass compositions used for making resistor inks are given below in Table II.

TABLE II

| Component | Glass 1 | Glass 2 |
| --- | --- | --- |
| $Al_2O_3$ | 6.00 | |
| $B_2O_3$ | 39.00 | 19.60 |
| CaO | 5.00 | |
| $Co_3O_4$ | | 2.00 |
| MgO | | 24.50 |
| $SiO_2$ | | 24.50 |
| ZnO | 50.00 | 29.40 |
| Particle Size, mm | 11–13 | 10–12 |

The resultant mixture can also include a TCR modifier, such as $BaTiO_3$ powder.

The above glasses are mixed with the $RuO_2$ powder, optional modifier and a suitable organic vehicle to form a screen printable composition that can be fired at low temperatures, similar to the firing temperature of the green tapes they will be applied to. The resistor ink powder generally contains about 17.33 to 24.8% by weight of $RuO_2$, about 74.3–81.7% by weight of Glass 1, and about 0.99 to 1.10% by weight of barium titanate as a TCR modifier. The preferred compositions contains about 19.8 to 23.14% by weight of $RuO_2$, about 75.87 to 79.21% by weight of Glass 1 and about 0.99–1.1% by weight of $BaTiO_3$.

When glass 2 is used, the amounts of glass and barium titanate can be higher; up to about 2.0% by weight of barium titanate and up to about 85% by weight of Glass 2.

Resistor inks were screen printed onto a laminated green tape stack in various patterns (½ squares and squares) in sizes from 0.508×0.508 to 2.032×4.064 mm in size. Green tape compositions suitable for use herein include the following ingredients, summarized in Table III. The median particle size of the glass and filler materials are given in microns.

TABLE III

| Material | Function | Comp. 1 | Comp. 2 |
| --- | --- | --- | --- |
| Glass 2 (10–12.5 μm) | Crystallizing glass | 57.34 | 57.79 |
| P12 glass* (6.5–8 μm) | Non-crystallizing glass | 6.98 | 7.03 |
| Forsterite (3–5 μm) | Ceramic filler | 7.27 | 4.42 |

TABLE III-continued

| Material | Function | Comp. 1 | Comp. 2 |
| --- | --- | --- | --- |
| Cordierite (2–3 μm) | Ceramic filler | 1.09 | 3.44 |
| Hypermer PS2[1] | Dispersant | 0.58 | 0.58 |
| Butvar B98[2] | Binder | 2.04 | 2.04 |
| Santicizer 160[3] | Plasticizer | 1.36 | 1.36 |
| Methyl ethyl ketone | Solvent | 11.67 | 11.67 |
| Anhydrous ethanol | Solvent | 11.67 | 11.67 |

*10% of $Al_2O_3$, 42% Pbo; 38% $SiO_2$ and 10% ZnO
[1]Registered Trademark of ICI America Inc
[2]Registered Trademark of Monsanto Co.
[3]Registered Trademark of Monsanto The resistors were terminated with a silver conductor ink which was also screen printed. A suitable silver ink composition includes 83.78 weight % of silver powder, 0.65 weight % of glass 2, 1.22 weight % of a dispersant, 0.88 weight % of ethyl cellulose resin, 0.80 of Elvacite 2045 resin (available from Monsanto Company), and a mixed solvent of 3.32 weight % of texanol, 6.81 weight % of terpineol and 2.54 weight % of butyl carbitol.

The green tape stacks were laminated together and placed on a ferro/nickel/cobalt/manganese alloysupport substrate and 5 co-fired in air at 850–900° C. The resistors were printed and buried one layer below the top surface of the ceramic stack. After co-firing, the resistors were then connected to the outside by printing with a silver-palladium or gold conductor ink and post-fired at 700–750° C. in air.

Table IV below summarizes the $RuO_2$-glass compositions and the properties of the fired resistors. In Table IV, the compositions are given in % by weight, and TCR was measured from room temperature to 125° C. A short term overload test (STOL) was also performed.

TABLE IV

| Composition | R(KΩ/sq) | TCR, ppm/° C. | STOL |
| --- | --- | --- | --- |
| 15% $RuO_2$ 85% Glass 2 | 99.9 | −80 | |
| 22.5% $RuO_2$ 75.5% Glass 2 2.0% $BaTiO_3$ | 5.08 | −111 | 200 V/5 sec/ 0.06% ΔR |
| 22.8% $RuO_2$ 76.2% Glass 2 2.0% $BaTiO_3$ | 4.00 | 28 | |
| 24.75% $RuO_2$ 74.26% Glass 2 0.99% $BaTiO_3$ | 0.86 | 209 | 40 V/5 sec/ 4.5% ΔR |
| 21.5% $RuO_2$ 77.6% Glass 1 0.9% $BaTiO_3$ | 1.01 | −20 | |
| 21.6% $RuO_2$ 77.9% Glass 1 0.5% $BaTiO_3$ | 0.46 | 153 | 150 V/5 sec/ 1.1% ΔR |
| 18% $RuO_2$ 82% Glass 1 | 0.52 | 262 | |
| 10% $RuO_2$ 90% Glass 1 | 22.9 | 44 | |
| 24.8% $RuO_2$ 74.3% Glass 1 0.99% $BaTiO_3$ | 0.54 | 25 | |
| 18.9% $RuO_2$ 80.6% Glass 1 0.5% $BaTiO_3$ | 0.94 | 117 | |

Thus the use of Glass 2 was effective to form high value resistors of over 2 Kohms/sq. The Glass 1 compositions were chosen for further development of a 1 Kohm/sq resistor.

The above resistor compositions were admixed with an organic vehicle to form an ink composition, using a dispersant (1.44% by weight), ethyl cellulose Resin N300 (0.10% by weight), Elvacite resin 2045 (3.93% by weight), and 25.18% of a mixed solvent of terpineol and butyl carbitol. The resistor ink was adjusted to about 38 volume % solids In order to maximize circuit density, it is desirable to print small size resistors, such as patterns of 0.508×1.016 to 1.016 to 2.032 mm, to obtain a 510 ohm resistor. Various resistor inks were made having varying ratios of solids to adjust the resistance and TCR values while keeping the volume % constant at 38%, and maintaining the dispersant concentration constant at 2 weight % of the total powder weight. The powder components of useful resistor inks are summarized below in Table V.

TABLE V

| Material | Composition, weight % | Preferred composition Weight % |
|---|---|---|
| $RuO_2$ | 17.33–24.8 | 19.8–23.14 |
| Glass 1 | 74.3–81.7 | 75.87–79.21 |
| $BaTiO_3$ | 0.99–1.10 | 0.99–1.1 |

Suitable resistor ink compositions made from the above powder mixtures are shown below in Table VI

TABLE VI

| | | Ink Compositions, weight % | | |
|---|---|---|---|---|
| Material | Function | 1 | 2 | 3 |
| $RuO_2$ | Conductor | 16.70 | 14.42 | 14.93 |
| Glass 1 | Sintering aid | 54.73 | 57.59 | 56.15 |
| $BaTiO_3$ | TCR Control | 0.71 | 0.72 | 56.15 |
| Hypermer PS2 | Dispersant | 1.43 | 1.44 | 1.45 |
| 15% Elvacite 2045/terpineol | Binder/solvent | 25.12 | 25.84 | 25.38 |
| 7.5% ethyl cellulose N300 in butyl carbitol/terpineol | Binder/solvent | 1.31 | 1.32 | 1.30 |

After screen printing resistors on one layer of 4–5 layer stack of laminated green tapes as above which had been co-fired onto a support of a copper clad ferro/nickel/cobalt/manganese alloy at 850–900° C., a top surface conductor ink made from silver-palladium or gold was applied and post fired at 750° C. The resistance was measured at DC or low frequency (10 KHz) and the TCR was calculated from the resistance measured at room temperature and at 125° C. The results are shown below in Table VII.

TABLE VII

| Ink | Size mm | Thick μm | Area (sq) | TCR, co-fired R(KΩ) | TCR, co-fired ppm/° C. | TCR, post-fired R(KΩ) | TCR, post-fired ppm/° C. | TCR, post-fired R(KΩ/sq) |
|---|---|---|---|---|---|---|---|---|
| 2 | 0.51 × 1.02 | 18.3 | 0.496 | 0.438 | 91 | 0.472 | 85 | 0.952 |
| | 1.02 × 2.03 | 18.7 | 0.496 | 0.501 | 10 | 0.536 | 9 | 1.080 |
| | 1.52 C 3.05 | 14.3 | 0.496 | 0.563 | −18 | 0.598 | −34 | 1.206 |
| 3 | 0.51 × 1.20 | 18.0 | 0.506 | 0.434 | 58 | 0.471 | 75 | 0.931 |
| | 1.02 × 2.03 | 16.0 | 0.502 | 0.504 | 1 | 0.542 | −9 | 1.080 |
| | 1.52 C 3.05 | 14.5 | 0.505 | 0.543 | −46 | 0.582 | −34 | 1.154 |
| 2 | 0.51 × 1.02 | 19.2 | 0.461 | 0.412 | 62 | 0.442 | 58 | 0.959 |
| | 1.02 × 2.03 | 19.3 | 0.487 | 0.503 | −59 | 0.540 | −54 | 1.109 |
| | 1.52 × 3.05 | 13.1 | 0.490 | 0.617 | −64 | 0.660 | −82 | 1.347 |

It is apparent that resistance values increase after post firing at 750° C. by an average of 7.3%. In addition, resistor values increase with increasing resistor size. This increase in resistance value with increasing size is due to dilution of the resistor by the silver terminating conductor layer during co-firing, which decreases sheet resistance for smaller size resistors.

Additional resistors from resistor ink compositions 1 and 2 are given below in Tables VIII and IX respectively. TCR was measured at room temperature and 125° C.

TABLE VIII

| | | Resistance (ohms) | | Postfired TCR |
|---|---|---|---|---|
| Size, mm | Area, mm² | Cofired | Postfired | (ppm/° C.) |
| (1) Square Resistors: | | | | |
| 0.51 × 0.51 | 0.258 | 721 | 778 | −43.4 |
| 1.02 × 1.02 | 1.032 | 922 | 1003 | −94.6 |
| 1.52 × 1.52 | 2.323 | 976 | 1064 | −111 |
| (2) 1/2 Square Resistors: | | | | |
| 0.51 × 1.02 | 0.516 | 459 | 496 | −55 |
| 1.02 × 2.03 | 1.065 | 498 | 541 | −92 |
| 1.52 × 3.05 | 4.645 | 511 | 557 | −108 |
| 2.03 × 4.06 | 8.258 | 534 | 582 | −118 |

The print thickness of the 1:2 1.02×2.03 mm resistor was 18.6 microns.

TABLE IX

| | | Resistance (ohms) | | Postfired TCR | Thick |
|---|---|---|---|---|---|
| Size, mm | Area, mm² | Cofired | Postfired | (ppm/° C.) | (μm) |
| (1) Square resistors | | | | | |
| 0.51 × 0.51 | 0.258 | 957 | 1022 | −2 | |
| 1.02 × 1.02 | 1.032 | 1086 | 1173 | −55 | |
| 1.52 × 1.52 | 2.323 | 1109 | 1200 | −74 | |
| (1/2) Square resistors | | | | | |
| 0.51 × 1.02 | 0.516 | 525 | 563 | −9 | 15.3 |
| 1.02 × 2.03 | 2.065 | 547 | 591 | −53 | 15.2 |
| 1.52 × 3.05 | 4.645 | 562 | 608 | −66 | 13.8 |
| 2.03 × 4.06 | 8.258 | 566 | 612 | −70 | |

Figure 2:
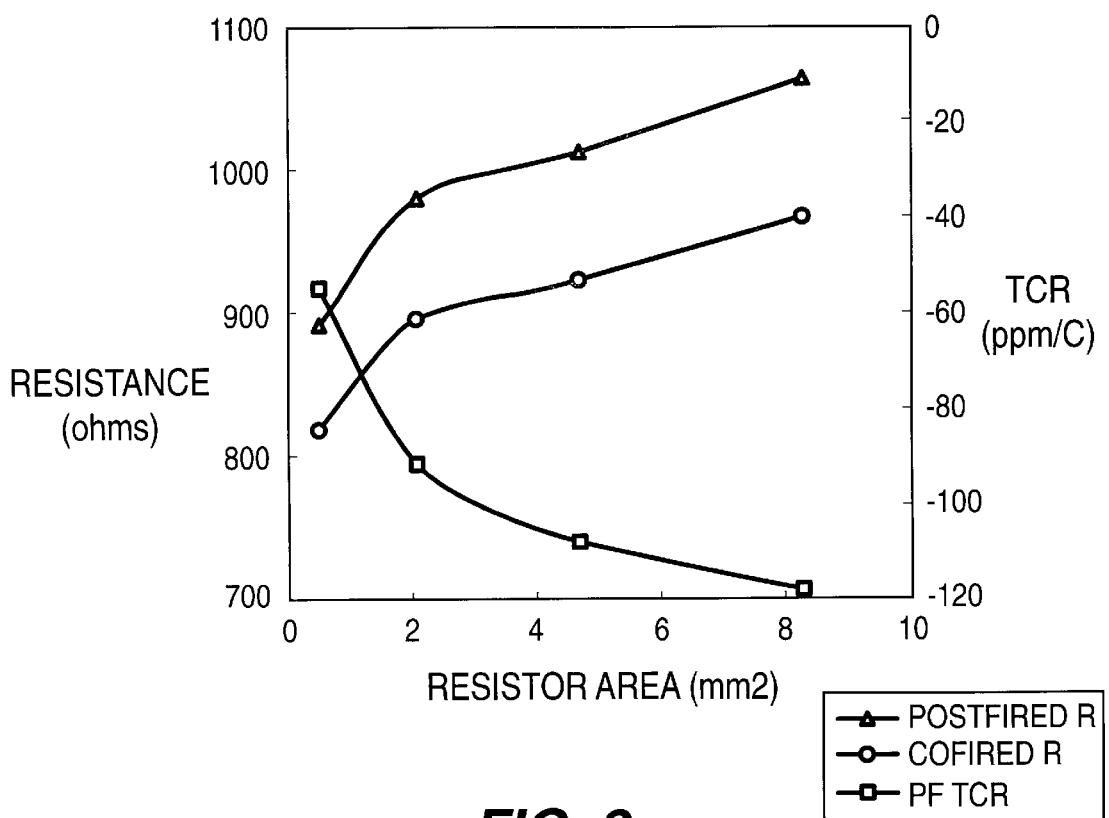
FIG. 2 is a graph of resistor area versus resistance and TCR for resistors having a rectangular configuration.

The data for resistors of the resistor ink composition 1 is plotted in FIGS. 1 and 2 which are graphs of resistance versus resistor area for (1) square resistors and for (1/2) resistors respectively.

The above resistors were also subjected to reliability testing. Test 1 was for 1000 hours at 85° C./85% RH, Test 2 was cycling over 200 times between −55 and 125° C. Test 3 applied 15.5 Watts/cm² of power to the resistor at 70° C. for 1000 hours. The resistors passed these tests.

Resistor ink 1 was used to make a 510 ohm buried resistor 1.016×2.032 mm in size in a receiver board designed for operation at 1 GHz. A resistance value of 510 ohms ±10% was obtained after post firing, providing the dried ink thickness was maintained at between 18 and 25 microns.

Although the invention has been described in terms of specific materials, it will be apparent to one skilled in the art that other materials and combinations thereof can be substituted. Thus the invention is only meant to be limited by the scope of the appended claims.

We claim:

1. A ceramic multilayer printed circuit board including embedded resistors comprising a screen printed resistor layer of ruthenium oxide and a low firing temperature glass selected from the group consisting of a glass comprising 3–7 percent by weight of alumina, about 30 to 40 percent by weight of boron oxide, from about 3–7 percent by weight of calcium oxide and about 45 to 55 percent by weight of zinc oxide and a glass comprising 10–35 percent by weight of boron oxide, about 10 to 30 percent by weight of magnesium oxide, about 10 to 40 percent by weight of silica and about 20–55 percent by weight of zinc oxide, said resistor layer having resistor value of from 300 ohm/sq to 100 Kohms/sq and a TCR less than or equal to 200 ppm/° C. over a temperature range of room temperature to 125° C. and printed onto a green tape stack laminated to a metal support board and covered with one or two green tape layers that are coated with a conductive metal layer.

2. A ceramic multilayer printed circuit board according to claim 1 wherein said metal support board is of a ferro/nickel/cobalt/manganese alloy.

3. A ceramic multilayer printed circuit board according to claim 1 wherein said glass comprises from about 3–7 percent by weight of alumina, about 30–40 percent by weight of boron oxide, from about 3–7 percent by weight of calcium oxide and about 45 to 55 percent by weight of zinc oxide.

4. A ceramic multilayer printed circuit board according to claim 1 wherein said glass comprises about 10–35 percent by weight of boron oxide, about 10–30 percent by weight of magnesium oxide, about 10–40 percent by weight of silica and about 20–55 percent by weight of zinc oxide.

5. A ceramic multilayer printed circuit board according to claim 4 wherein a ceramic filler is added to said glass composition.

6. A ceramic multilayer printed circuit board according to claim 5 wherein a non-crystallizing glass is added to the glass-ceramic mixture.

7. A ceramic multilayer printed circuit board according to claim 1 wherein said resistor layer includes barium titanate in an amount sufficient to adjust the thermal coefficient of resistance to a desired value.

8. A ceramic multilayer printed circuit board according to claim 1 wherein said embedded resistors are terminated with a screen printed conductor ink layer.

9. A ceramic multilayer printed circuit board according to claim 8 wherein said conductor ink layer is of silver.

* * * * *